United States Patent Office 3,687,663
Patented Aug. 29, 1972

3,687,663

DIAZO-OXIDES OF SULFONIC ACID AMIDES AND/OR ESTERS AND PHOTOGRAPHIC ELEMENT AND USE THEREOF

Albert Bloom, Boston, Mass., assignor to Industrial Dyestuff Company, Providence, R.I.

No Drawing. Filed May 19, 1970, Ser. No. 38,912
Int. Cl. C07c *113/00;* G03c *1/54;* G03f *7/08*
U.S. Cl. 96—33 9 Claims

ABSTRACT OF THE DISCLOSURE

Diazo-oxides of sulfonic acid amides and/or esters containing a plurality of aromatic ether groups, e.g. the bis-diazo-oxide of naphthalene sulfonic acid amide of the p-aminophenyl diether of bisphenol A, and their use in printing plates, electronics, and other fields which use light-sensitive materials. Upon exposure through a transparency the diazo-oxides decompose and the decomposition products can be removed by alkali. Where the diazo-oxide has not been exposed and decomposed the plate will accept printing ink so as to be able to print large numbers of positive reproductions of the original transparency, or it may resist the action of etchants.

This invention relates to diazo-oxides of aromatic sulfonic acid amides or esters and their use in making plates for the printing industry, as well as in the electronic field and similar areas where use is made of their photosensitive properties.

N-substituted diazo-oxides of aromatic sulfonamides have been the subject of a considerable literature. For example, in "Light-Sensitive Systems" by J. Kosar (published by John Wiley and Sons, 1965) such materials are discussed in chapter 7. A list of sulfonamides is shown on pages 343–345: U.S. Pat. No. 2,797,213 discloses diazo-oxides of aromatic sulfonamides wherein the amide nitrogen is substituted by a rosin acid radical. U.S. Pat. No. 3,046,110 covers a wide variety of such sulfonamides in which the amide nitrogen is substituted by either aromatic or aliphatic groups, e.g. the condensation of an aromatic diazo-oxide sulfonyl chloride with aromatic diamines or aminophenols to give diamides or amide/ester compounds. In U.S. Pat. No. 3,046,111 aromatic diazo-oxide sulfonamides are disclosed, wherein the amide nitrogen is part of an imidazole ring. U.S. Pat. No. 2,766,118 claims such sulfonamides wherein the amide nitrogen is attached to another nitrogen (hydrazine structure).

The utility of water insoluble diazo-oxide sulfonic acid derivatives results from their photodecomposition to give acidic products, which may be removed with an alkaline agent. In practice, a suitable substrate is coated with a solution of the material in an organic solvent. After removing the solvent, the so sensitized material is exposed to an ultraviolet light source through a master or transparency, thereby decomposing the diazo-oxide condensation product. Subsequent treatment with an alkaline material removes the decomposed diazo-oxide in the exposed portion, leaving a positive of the diazo-oxide in each of the unexposed portions. This positive may be used in photomechanical reproduction, as an acid resistant area in etching or in a variety of other ways.

This brief description of the mode of utilizing aromatic diazo-oxide sulfonic acid dervatives in technical applications shows that if such derivatives are to be useful they should be soluble in relatively simple organic solvents which do not affect the substrate. They should be essentially insoluble in water, acidic solutions or alkali of a strength needed to dissolve their photodecomposition products. They should adhere tenaciously to the substrate, be resistant to abrasion and, for certain applications, be receptive to grease or oil so as to attract and hold printing inks, and desirably should be compatible with the various polymers, resins, etc. that those versed in the art utilize in their formulations and processing. The above requirements explain why so very few aromatic diazo-oxide sulfonic acid derivatives have had industrial acceptability.

It is an objective of this invention, therefore, to provide light sensitive high molecular weight derivatives of aryl diazo-oxide sulfonic acids, soluble in solvents suitable for coating operations and having properties meeting the above requirements.

In accordance with the present invention there are provided new compounds of the formula

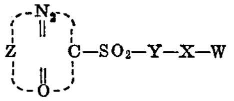

(I)

wherein

Z represents the atoms necessary to complete a cyclohexadiene ring, a dihydronaphthalene ring or a polyhydronaphthalene ring in which the $=N_2$ and $=O$ occupy adjacent positions, Y represents an oxygen or —NR radical, X represents a divalent organic chain containing a plurality of oxygen atoms of which at least two are each directly linked to an aromatic ring, W represents hydrogen, Y—R or

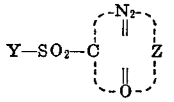

and

R represents hydrogen, or alkyl, aryl or aralkyl.

Thus

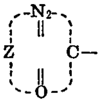

represents a phenyl, naphthyl or dihydronaphthyl radical wherein one of the double bonds is saturated and replaced at its terminals by $=N_2$ and $=O$. Representative radicals include the 3-diazo-4-oxo-phenyl

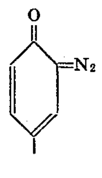

(II)

optionally substituted as by halo or lower alkyl, e.g. 3-chloro- or preferably a naphthalene diazooxide in which the diazo and oxide groups are in adjacent $\alpha,\beta$-positions such as 5,6,7,8-tetrahydro-4-diazo-3-oxo-naphthyl-(2)

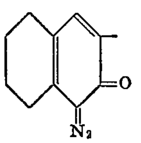

(II)

optionally substituted as above; and 3-diazo-4-oxo-naphthyl

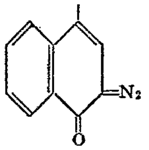

(IV)

6-diazo-5-oxo-naphthyl

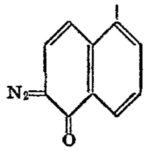

(V)

and 5-diazo-6-oxo-naphthyl-(2)

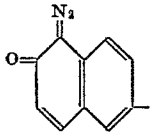

(VI)

which also may be optionally substituted.

Of these, V is preferred. Y preferably represents oxygen or an unsubstituted amino radical although it may also represent the radical of an alkyl, aryl or aralkyl amine especially wherein the aryl is phenyl, the alkyl is lower alkyl such as methyl, ethyl, propyl and the like, and the aralkyl is aryl substituted lower alkyl such as benzyl, phenylethyl, and the like.

The divalent organic chain represented by X must contain a plurality of oxygen atoms of which at least two are directly linked to an aromatic ring, preferably linking two aromatic rings. Representative aromatic rings are those of benzene naphthalene, di- and tetra-hydronaphthalene, anthracene, pyridine, quinoline and the like, although the hydrocarbons, i.e. arylenes, are preferred. The benzene ring may be one of a sequence such as biphenyl wherein benzene rings are directly connected, or the benzene ring may be connected to another benzene ring or rings through the intermediary of another group such as an aliphatic hydrocarbon, sulfone group, thio methane, 2,2-bis-phenyl-propane, diphenylsulfone, and the like.

Desirably, counting atoms continuously in the same direction the chain contains a sequence of at least about twelve atoms and has a molecular weight of at least about 150 and preferably at least about 250. In counting atoms in sequence a benzene ring tied in the chain at its 1,2-positions would count 2, a benzene ring tied in 1,4-positions would count as 4, a 4,4'-biphenyl would count as 8, a 4,4'-diphenylsulfone would count as 9, and so forth. It is believed, in retrospect, that the superior properties of solubility and the like discussed hereinafter are at least in part directly attributable to the length and weight of this chain.

The chain is preferably made up of carbon and oxygen atoms only, and non-interfering pendant groups such as halogens may be present. The oxygen-aromatic linkages referred to hereinabove should be etheric and preferably the etheric oxygens connect two aromatic rings. Representative chains include sequences of alternating oxygen atoms and benzene rings, i.e. runs of phenylene oxide

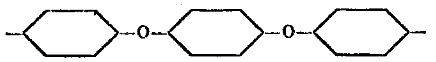

(VII)

and especially chains containing at least four aromatic rings in the sequence such as aromatic di-ethers of 4,4'-dihydroxydiphenyl-dimethylmethane (bisphenol A) such as

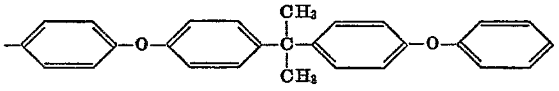

(VIII)

and

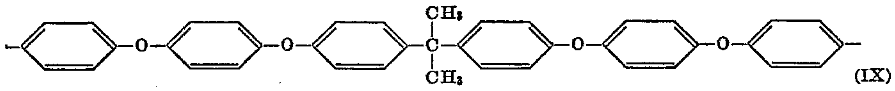

(IX)

as well as

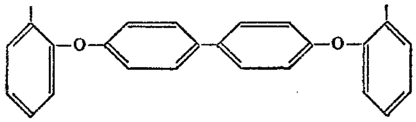

(X)

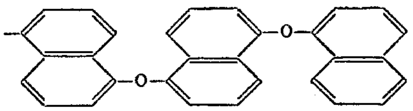

(XI)

and the like.

Of these, oxygen atoms linking phenylene, naphthylene, bisphenylene or bis(phenylene)alkane to each other or to one another are preferred.

When W is not hydrogen, it may be —Y—R in which case when R is hydrogen the molecule terminates in a hydroxyl group when Y is oxygen, or in a primary amino group when Y is —NR; or when Y is —NR and R is alkyl, aryl or aralkyl the molecule terminates in a secondary amine. When W is —Y—R and Y is —NR—, and both R's are not hydrogen, then the terminal of the molecule will be a tertiary amine.

Preferably, however, W is

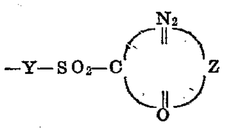

so that the molecule will have two diazo-oxide groups, one at each end; it could, of course, have more than two through the presence of branch chains. In such event, desirably at least one and preferably both of the Y groups are —NH— or —NR— so that the —$SO_2$—Y— linkage is a sulfonamido.

Preferably R is lower alkyl, aryl, lower alkyl-substituted aryl and aryl-substituted lower alkyl.

Of the various compounds embraced herein the preferred material is

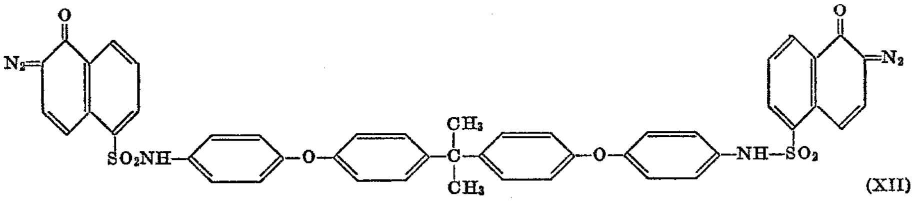

(XII)

which corresponds to general Formula I wherein

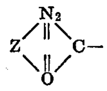

represents a diazooxy-dihydronaphthalene ring which together with $SO_2$ is the 2-diazonaphthol-(1)-5-sulfonyl radical, i.e. the naphthoquinone-(1,2)diazide-(2)-5-sulfonyl radical; wherein Y is —NH—; X contains 4 phenylene radicals in two pairs whose members are connected by etheric oxygens, has a molecular weight of 378, a sequence of 19 atoms and contains only carbon, oxygen and hydrogen atoms; and W represents

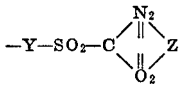

wherein Y and

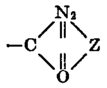

are the same as at the other end of the molecule.

The novel compounds are especially useful in making lithographic plates, giving clear, sharp images when used in conventional manner. While they have a long shelf life when properly stored, they decompose rapidly when exposed to ultraviolet light. While the decomposition products upon exposure are readily soluble in alkali, the unexposed or desensitized compounds are quite insoluble in alkali and water so that sharp demarcations result between the exposed and unexposed areas, ultimately resulting in sharp images. The compounds are highly compatible with the resins frequently jointly deposited on the plate so that a homogeneous coherent layer is formed which layer is firmly held on the plate by virtue of the compatibility as well as by virtue of the affinity of the new molecules for the metals of which the plates are usually made. While the molecules are highly oleophilic and thus attract printing ink, their higher molecular weights and longer chains make them less soluble in the components of printing inks so they will not be removed from the plate as readily, i.e. they can be used to make a greater number of sharp copies.

The novel compounds can be synthesized from known starting materials, preferably from automatic dihydroxy compounds such as bisphenol A (4,4′-dihydroxydiphenyl-dimethylmethane); 4,4′ - dihydroxydiphenyl; 1,4 - dihydroxybenzene; 4,4′-dihydroxydiphenylsulfone; and the like. A halo- and nitro-substituted aromatic compound such as p-nitrochlorobenzene in twice the molar amount is reacted therewith in a solvent, generally at reflux, in the presence of an acid binding agent to remove two moles of hydrohalic acids and give the di-ether, terminated by a nitro group at each end. The nitro groups are reduced to amino groups which, upon condensation with the appropriate diazo-oxyaromaticsulfonyl chloride gives the desired product.

If longer chains are desired, the intermediate diamino compound may first be diazotized and the diazo converted to phenolic hydroxyls which may then be further etherified with halonitrobenzenes, reduced and then condensed.

From this exposition alternative routes for synthesis will readily suggest themselves.

The novel compounds after preparation and purification can be utilized in manner conventional for other compounds employed in the lithographic printing plate field. They are dissolved in a solvent such as methylethyl ketone, Cellosolve (ethoxyethanol), cyclohexanone, dioxane, tetrahydrofurane, methyl Cellosolve (methoxyethanol), dimethylformamide, and the like, possibly along with a resin, such as a cellulose ester, polyvinyl acetate, polyvinyl acetals, methyl acrylates and urea of melamine formaldehyde resins; the resins serve the multiple purpose of imparting toughness to the image areas, and increasing the oleophilicity of such areas when contacted with printing ink. The solution is applied to a plate which may be metal or even plastic, as by wiping or dipping. After drying, the coated plate is exposed to light through a positive transparency which results in decomposition of the diazooxide where light shone through. A dilute solution of alkali will wash away the decomposition product, exposing the support, but will not wash away unexposed diazooxide. If desired, the plate may be acid dipped or water washed to remove the alkali and to de-sensitize the diazooxide so it will not undergo decomposition during further use and handling. Upon application of printing ink, the ink will adhere only to those areas which have diazo-oxide and this positive image in printing ink can be transferred to a transfer roll of an offset printing press in known manner.

In another technique the plate, carrying diazo-oxide in selected areas, if metallic may be treated with acid to etch its face. The acid will remove metal from the exposed areas free of diazo-oxide so that the diazo-oxide areas will actually be raised above the background, permitting printing on a letter press. In another technique, if the metal plate is very thin and exists as a foil on a non-conductive backing, etching will remove the metal except along certain lines leaving a printed circuit suitable for use in the electronic arts.

The preparation and use of the novel compounds will now be shown in the following illustrative, non-limiting examples wherein all parts are by weight unless otherwise specified.

EXAMPLE I (a) 4,4′-bis-(p-nitrophenoxy phenyl)-dimethyl-methane

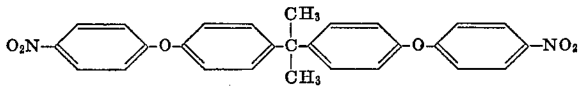

(XIII)

Into a suitable reaction vessel there are charged 109 g. of 4,4′-dihydroxydiphenyl-di-methyl-methane, 182 g. of p-nitro-chloro-benzene, 5,000 cc. of dimethylformamide and 183 g. of sodium carbonate. The mass is subjected to reflux for 18 hours after which it is drowned into ice water, forming a precipitate. The precipitate is filtered, washed with water, and recrystallized from di-methyl formamide. There are obtained 189 g. of 4,4′-bis(p-nitrophenoxy phenyl)-dimethyl-methane, M.P. 119–121° C.

(B) 4,4′ - bis(p - aminophenoxy - phenyl) - dimethyl methane

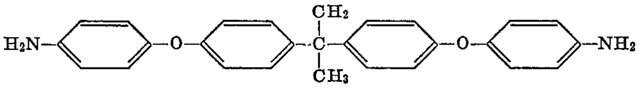

(XIV)

50 g. of the above dinitro compound are suspended in 1,000 cc. of methanol and subjected to hydrogenation at 50° C. and 60 p.s.i.g. in the presence of a catalyst of palladium on charcoal. After removal of the catalyst the solution is drowned into water to give the amine in 92% yield, M.P. 125–128° C.

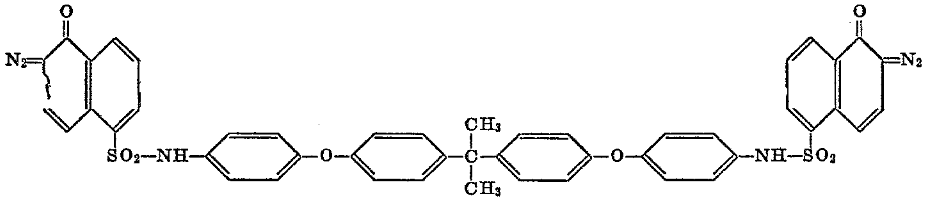

(XV)

Into a suitable reaction vessel there are charged 0.002 mole (20.5 g.) of 4,4'-bis(p-aminophenoxy-phenyl)-dimethyl-methane, 200 cc. of 1,4-dioxane, and the mass is stirred to a solution. There are added 50 cc. of 10% sodium carbonate aqueous solution. Next there is added a solution of 27 g. of naphthylenediazo oxide-5-sulfonylchloride in 125 cc. of 1,4-dioxane. The mass is warmed to 40° C. and an additional 25 cc. of 10% sodium carbonate solution are added. After stirring at 40° C. for 15 minutes the contents are drowned in 1000 cc. of ice water containing 10 cc. of concentrated HCl yielding a precipitate which is filtered off, washed with water and dried. There are obtained 44.4 g. of orange-brown powder.

(D) The product of (C) above is dissolved in methyl-ethyl ketone to form a 3% solution which is flow coated onto the roughened surface of aluminum foil. After drying with hot air, the light sensitive sheet is exposed through a photographic film positive to the light emitted by a carbon arc lamp. The exposed plate is developed by wiping with a one percent solution of trisodium phosphate. The developed plate is wiped with a one percent aqueous solution of phosphoric acid to neutralize any remaining alkali. The plate now consists of an ink receptive image area formed by the original diazo compound, and a water receptive, ink repellent non-image area consisting of the bared aluminum surface. This plate faithfully reproduces the film positive and is capable of printing several score thousand copies on a lithographic press.

Substantially similar results are obtained replacing the methyl-ethyl ketone in whole or in part with one or more of methyl Cellosolve, Cellosolve, cyclohexanone, dioxane, tetrahydrofurane.

EXAMPLE II (A) In a control experiment, .002 mole of 4,4'-diaminodiphenyl ether are substituted for the amine of Example 1(C). There are obtained 31.1 g. of the compound having the following structural formula:

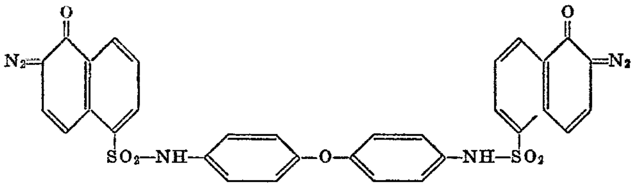

(XVI)

(B) The product of (A) above is dissolved and formed into a coating as in Example I(D) above. Upon exposure through a photographic film positive and alkaline wipe, the diazo oxide washes away not only in the exposed areas but in part in the unexposed areas as well, whereby the images are poorly defined. It is found not to be ink receptive and accordingly cannot be used for printing.

EXAMPLE III (A)

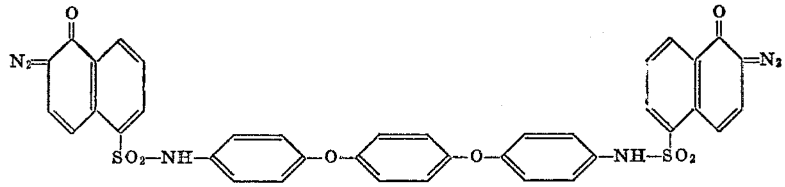

(XVII)

In manner similar to Example I(c), 1,4-bis-(p-aminophenoxy)-benzene (M.P. 166° C. described in Atti. Accad. Gioenia Sci. Nat. Catania, vol. 11, 1958, pages 184–194, prepared by hydrogenation of the corresponding di-nitro compound melting at 232° C., in turn prepared from hydroquinone and p-nitro chlorbenzene as described in J. Chem. Sec., 1958, page 3298) can be condensed with naphthylenediazo oxide-5-sulfonylchloride in dioxane to give the compound shown above.

(B)

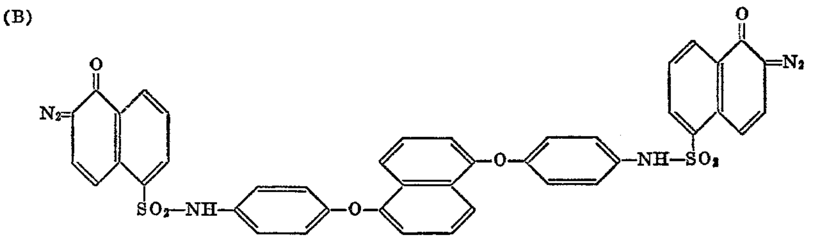

(XVIII)

In similar fashion 1,5-dihydroxynaphthalene may be substituted for the hydroquinone of (A) to give the compound shown above.

The foil to which the novel compounds are applied may be non-conductive, e.g. films of cellulose acetate or polyester or the like, or they may be conductive, e.g. aluminum or copper. By selective removal of the coating, the metal foil is partially exposed so it may be etched away, leaving metal only where the diazo oxide was not decomposed during exposure; this is of course a form of printed circuit.

Various changes and modifications can be made without departing from the spirit and scope of the present invention.

What is claimed is:

1. Diazooxides of the formula

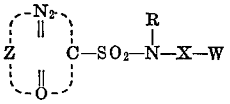

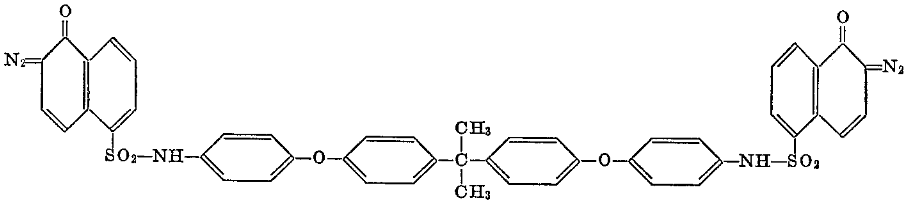

wherein

Z is the atom necessary to complete a cyclohexadiene ring, a dihydronaphthalene ring or a polyhydronaphthalene ring or a polyhydronaphthalene ring in which the $=N_2$ and $=O$ occupy adjacent positions;

X is a divalent organic chain containing a plurality of oxygen atoms of which at least two are each directly linked to an aromatic ring, and wherein X is a repeating unit which varies from the formula —AR—O—Ar—O—Ar— to the formula

—Ar—O—Ar—O—Ar—O—Ar—O—Ar— wherein the end groups of said unit are Ar, and each Ar independently is phenylene, naphthylene, biphenylene or bis(phenylene)alkane;

W is hydrogen or

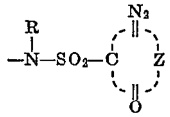

and

R is hydrogen, or alkyl, aryl or aralkyl.

2. Diazooxides according to claim 1 of the formula

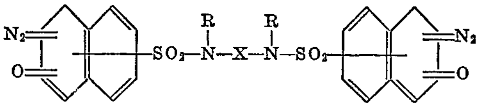

wherein the $N_2$ and O of each pair are in adjacent $\alpha,\beta$-positions on each naphthalene ring.

3. Diazooxides according to claim 2, wherein X is made up solely of carbon, hydrogen and oxygen atoms.

4. Diazooxides according to claim 2 wherein X is

—Ar—O—Ar—O—Ar—

5. Diazooxides according to claim 1 of the formula

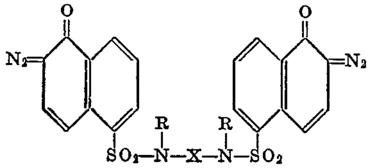

wherein X includes the radical

—Ar—O—Ar—O—Ar— each Ar independently is phenylene, naphthylene, biphenylene or bis(phenylene)alkane, and R is hydrogen, lower alkyl, aryl, aryl substituted-lower alkyl or lower alkyl-substituted aryl.

6. Diazooxide according to claim 1 of the formula

7. A light-sensitive plate comprising a base foil and a coating thereon comprising a light-sensitive diazooxide according to claim 1.

8. A process for preparing a developed plate comprising coating a foil with a solution of a light-sensitive diazooxide, according to claim 1, allowing the solvent to evaporate so as to leave on said foil a coating comprising said light-sensitive diazooxide, exposing said coating to light through a transparency whose image it is desired to reproduce, thereby to decompose and diazooxide in the areas where light was transmitted through the transparency, and removing the decomposition products by development in aqueous alkaline solution.

9. A light-sensitive plate according to claim 7, wherein said base comprises a conductive foil supported on a non-conductive backing, said coating being carried on said conductive foil, whereby upon exposure of said plate, removal of decomposed diazo-oxide and acid etching there is left on said non-conductive backing a printed circuit.

References Cited

UNITED STATES PATENTS

| | | | |
|---|---|---|---|
| 3,046,110 | 7/1962 | Schmidt | 96—91 D X |
| 3,046,118 | 7/1962 | Schmidt | 96—91 D X |
| 3,046,120 | 7/1962 | Schmidt et al. | 96—91 D X |
| 3,102,809 | 9/1963 | Endermann et al. | 96—91 D X |
| 3,106,465 | 11/1963 | Neugebauer et al. | 96—91 D X |
| 3,130,047 | 4/1964 | Uhlig et al. | 96—91 D X |
| 3,130,048 | 4/1964 | Fritz et al. | 96—91 D X |
| 3,130,049 | 4/1964 | Neugebauer et al. | 96—91 D X |
| 3,201,239 | 8/1965 | Neugebauer et al. | 96—91 D X |
| 3,188,210 | 6/1965 | Fritz et al. | 96—75 X |
| 3,502,470 | 3/1970 | Delzenne et al. | 96—91 D |
| 3,586,504 | 6/1971 | Coates et al. | 96—35.1 |
| 3,635,709 | 1/1972 | Kobayashi | 96—91 D |

FOREIGN PATENTS

| | | | |
|---|---|---|---|
| 706,028 | 3/1954 | Great Britain | 96—91 D |
| 737,379 | 9/1955 | Great Britain | 96—91 D |

CHARLES L. BOWERS, JR., Primary Examiner

U.S. Cl. X.R.

260—141; 96—36.2, 36.3, 75, 91 D

PO-1050
(5/69)

UNITED STATES PATENT OFFICE
CERTIFICATE OF CORRECTION

Patent No. 3,687,663 Dated August 29, 1972

Inventor(s) Albert Bloom

It is certified that error appears in the above-identified patent and that said Letters Patent are hereby corrected as shown below:

Col. 3, between lines 50 and 51, insert --group, and the like, e. g. diphenylmethane, triphenyl- --.

Col. 10, claim 8, line 27, change "and" to --said--.

Signed and sealed this 13th day of February 1973.

(SEAL)
Attest:

EDWARD M.FLETCHER,JR.
Attesting Officer

ROBERT GOTTSCHALK
Commissioner of Patents